United States Patent [19]
Puckette et al.

[11] Patent Number: 5,736,893
[45] Date of Patent: Apr. 7, 1998

[54] DIGITAL METHOD AND APPARATUS FOR REDUCING EMI EMISSIONS IN DIGITALLY-CLOCKED SYSTEMS

[75] Inventors: Robert B. E. Puckette, Corvallis; Preston D. Brown, Eugene, both of Oreg.

[73] Assignee: Hewlett-Packard Company, Palo Alto, Calif.

[21] Appl. No.: 592,975

[22] Filed: Jan. 29, 1996

[51] Int. Cl.[6] .................................................. H03D 1/04
[52] U.S. Cl. ........................ 327/551; 327/113; 327/117; 327/100; 377/48; 364/724.01; 375/200
[58] Field of Search .............................. 327/113, 126, 327/164, 165, 172, 551, 115, 117, 552, 156, 147, 295, 166, 167, 100; 375/200, 204; 364/703, 724.01; 377/47, 48

[56] References Cited

U.S. PATENT DOCUMENTS

| | | | |
|---|---|---|---|
| 4,023,116 | 5/1977 | Alfke et al. | 331/17 |
| 4,658,406 | 4/1987 | Pappas | 377/48 |
| 4,933,890 | 6/1990 | Nuytkens et al. | 364/721 |
| 5,287,296 | 2/1994 | Bays et al. | 364/703 |
| 5,305,632 | 4/1994 | Miller | 377/48 |
| 5,426,392 | 6/1995 | Kornfield | 327/551 |
| 5,488,627 | 1/1996 | Hardin et al. | 375/200 |
| 5,565,816 | 10/1996 | Coteus | 331/18 |

FOREIGN PATENT DOCUMENTS

| | | | |
|---|---|---|---|
| 0 163 313 | 5/1985 | European Pat. Off. | H03B 29/00 |
| 0431629 | 6/1991 | European Pat. Off. | |

OTHER PUBLICATIONS

Hardin et al., "Spread Spectrum Clock Generation for the Reduction of Radiated Emissions," IEEE Doc #0-7803-1398; Apr. 1994.

*Primary Examiner*—Timothy P. Callahan
*Assistant Examiner*—Dinh T. Le

[57] ABSTRACT

A clock reference frequency is digitally derived from a base signal, then digitally modulated by ramping the clock reference frequency up and down about a desired frequency. The modulation occurs in periodic fashion at a prescribed modulation frequency. Such modulation spreads the electromagnetic energy of the system signals over a band that is a portion of the desired clock frequency. As a result, energy in harmonics of the respective system signals also are spread. When the energy spreading of any system signal or harmonic of such signal occurs over a bandwidth greater than the 120 kHz bandwidth of conventional communication receivers, adverse EMI emissions are reduced.

21 Claims, 4 Drawing Sheets

DIGITAL METHOD AND APPARATUS FOR REDUCING EMI EMISSIONS IN DIGITALLY-CLOCKED SYSTEMS

CROSS REFERENCE TO RELATED APPLICATIONS

This invention is related to U.S. patent application Ser. No. 08/593,599 filed Jan. 29, 1996, for Division Of Input Frequency To Digitally Derive Arbitrary Output Frequency. The content of that application is incorporated herein by reference and made a part hereof.

BACKGROUND OF THE INVENTION

This invention relates generally to methods and apparatus for reducing electromagnetic interferences ('EMI') emissions in a digital system, and more particularly for reducing EMI emissions in a computer or other digitally-clocked system.

Electromagnetic interference is electromagnetic energy emitted from electronic devices which, either directly or indirectly, contributes to a degradation in performance of an electronic receiver or other electronic system. Poorly shielded electronic devices, for example, degrade radio and television signals resulting in audible or visible static at receivers picking up such signals. Governments typically regulate EMI emissions to enhance public use of the radio wave and other electromagnetic wave spectrums. In the United States, for example, the F.C.C. requires testing of devices and rates the devices by class according to their emissions. The United States F.C.C. Agency rates EMI emissions over a 120 kilohertz bandwidth. The 120 kHz bandwidth corresponds to the typical bandwidth of a conventional communication receiver, such as an FM receiver. Reduced EMI emissions within such bandwidth reduce the interference output perceived by a listener or viewer as, for example, static, white noise, or "ghosts."

Typical precautions taken by electronic manufacturers are to provide shielding of electronic devices to minimize EMI emissions. Computer manufacturers, for example, typically use shielded cables and shielded housings to minimize EMI emissions. This invention is directed toward a digital method and apparatus for spreading electromagnetic interference over a wide bandwidth so as to reduce the energy level within the 120 kHz bandwidth of commercial receivers.

SUMMARY OF THE INVENTION

According to the invention, EMI emissions in a digitally-clocked system are reduced by digitally modulating a reference signal. The modulating reference signal subsequently is used to derive one or more clock signals. Modulating the reference signal varies the reference signal and signals derived therefrom by a given percentage. For a reference signal modulated to vary between +/−1% of a desired reference frequency, for example, each clock signal derived therefrom also is varied by +/−1%. The +/−1% variation differs for differing embodiments according to a clock signal's accuracy, jitter and rated frequency specifications for the specific embodiment. By varying the reference signal by the exemplary +/−1%, the EMI emissions for the reference signal or any signal derived therefrom is spread over a corresponding +/−1% frequency band. In addition EMI emissions at harmonics of such derived signals also are spread over a +/−1% frequency band. Thus a 100 MHz derived signal is spread over +/−1%=2 MHz, (i.e., 99–101 MHz), while a harmonic of such signal at 200 MHZ is spread over +/−1%=4 MHz, (i.e., 198–202 Mhz).

Any signal or signal harmonic frequency band spanning more than 120 kHz spreads the EMI emission for the corresponding signal or harmonic beyond the 120 kHz band commonly used in commercial communication receivers. Accordingly, the effect of EMI emissions on commercial communication receivers is reduced. Such bandwidth also corresponds to the bandwidth used for rating EMI emissions of electronic devices in the United States. Thus, measured EMI emissions also are reduced for such signals.

According to one aspect of the invention, a clock reference signal is digitally modulated by digitally ramping the signal's frequency up and down about a desired reference frequency. The modulation occurs in periodic fashion at a prescribed modulation frequency. Such modulation spreads the electromagnetic energy of the reference signal over a band that is a small percentage of the desired reference frequency. Similarly, the electromagnetic energy for harmonics of such reference signal and signals derived from such reference signal is spread over a corresponding band (i.e., same percentage as for reference signal).

According to another aspect of the invention the energy spreading occurs for either a signal or a signal harmonic over a bandwidth greater than the 120 kHz bandwidth of interest for EMI measurement purposes. Spreading the energy uniformly over 240 kHz, for example, reduces EMI's impact and the measured EMI by a factor of two. Note that even a spread of less than 120 kHz about a given signal's frequency may result in a spreading of 120 kHz or more at harmonics of such given signal. Accordingly, overall EMI is reduced even if the frequency band for spreading energy of a given signal is less than 120 kHz. Specifically, overall EMI is reduced in such instance for significant harmonics having energy spread over a bandwidth greater than 120 kHz.

According to another aspect of the invention the reference signal to be modulated is derived from a base signal. The to-be modulated (i.e.., desired) reference signal is digitally derived from the base signal by a partial fractional expansion of the base signal's frequency. Such partial fractional expansion enables generation of any arbitrary reference signal frequency. The desired reference signal is derived by taking the closest corresponding transition of the base signal as the desired reference signal transition. In effect, the output clock signal frequency is dithered. Over the long term, an average desired reference frequency is achieved which need not be evenly divided into the base signal's frequency.

According to one embodiment, the partial fractional expansion is implemented as a chain of dividers. Each divider includes a divide-by term. Each divide-by term is a term of the fractional expansion. To derive the terms, the base signal frequency is divided by the desired reference frequency. The integer part of such division is the first divider's term, (i.e., the first term). The term for the succeeding divider is derived by inverting the remainder from the first division, and assigning the integer portion as the divide-by term, (i.e., the second term). The remainder of such second division then is inverted with the integer portion taken as the third term. The expansion continues out for as many stages of dividers as desired for a given accuracy. For example, to derive a 14.31818 MHz desired reference signal from a 40 MHz base signal, the partial fractional expansion yields a first term equal to 2, a second term equal to 1 and a third term equal to 3. Such terms are assigned to a chain of dividers which receives the 40 MHz base signal. The result is an average reference signal frequency of 14.31818 MHz at the output of the first divider.

According to a preferred embodiment of the invention, a personal computer clock reference signal (e.g., the desired reference frequency signal) is ramped up by approximately 1% faster than a desired frequency and ramped down to approximately 1% slower than the desired frequency at a prescribed modulation frequency. Consider the embodiment in which a clock reference signal has a desired frequency of 14.318 MHz. By modulating such frequency by +/−1%, the reference signal varies between 14.175000 MHz and 14.46136 MHz. This represents a frequency band spanning 286.4 kHz. Thus, the reference signal EMI emissions are spread over more than double the 120 kHz range of significance, in effect reducing the adverse EMI emissions. For larger harmonics the +/−1% spread results in a frequency bandwidth even larger than the 286.4 kHz.

According to another aspect of the invention the modulation waveform is shaped to uniformly distribute the frequency variation of the reference signal. Thus, when a signal's energy is spread over more than double the 120 kHz range, the EMI emissions are reduced by a factor of more than two. In a preferred embodiment a triangular modulation waveform is used.

According to another aspect of the invention, one or more clock signals derived from the modulated reference signal also have a frequency which varies by the same percentage. The modulation of the reference signal moves through the clock generation circuitry receiving the reference signal. Specifically, phase-locked loop and other frequency synthesis devices are keyed to the modulating reference signal resulting in modulating clock signals. In specific embodiments, such modulated clock signals occur without altering or adding circuitry to the clock generation circuits. For a reference signal which modulates at +/−1%, one or more derived clock signals also modulate at +/−1%. For example, a 400 MHz CPU clock signal derived from the reference signal now modulates over a frequency range between 396 MHz and 404 MHz. This corresponds to an 8 MHz frequency band. Such band is substantially larger than the 120 kHz band of significance for EMI measurement. Specifically, spreading the EMI energy over 8 MHz corresponds to an 18 dB reduction in measured EMI emissions. EMI emissions are reduced for other signals derived from the modulated reference signal in the same manner.

A challenge in reducing EMI emissions by modulating a reference signal is to meet jitter and accuracy requirements of derived clock signals. A CPU clock for requires a cycle-to-cycle jitter of less than 200 pico-seconds, according to one conventional standard. As another example, a display output frequency deviation of even 1% will cause characters to appear blurry or smeared. As still another example, a system timer which maintains the time and date is required to be accurate within 1 part per million. Thus, digital clocks are required to be stable and easy to produce. Analog approaches toward spreading the energy to reduce measured EMI emissions are unable to meet such challenges. The method of this invention, however, is able to spread the emissions without adversely impacting the jitter and accuracy requirements of the system clock signals.

According to another aspect of the invention, expected adverse impacts from modulating the VGA output clock are overcome by using a modulation frequency having a period matching the horizontal retrace time of the display device of importance to the display device is that the pixel placements line up vertically and horizontally. Varying the VGA output frequency might cause misalignment and thus blurry images. However, by matching the modulation frequency to the horizontal retrace frequency, each line scanned onto the display device starts at the same relative time position within a modulation waveform period. Thus, pixels are slightly closer together at one portion of the line and farther apart at another portion of the line, but the pixels are still aligned vertically and horizontally.

According to another aspect of the invention, jitter requirements are met by uniformly varying the change in frequency in the modulation waveform. Alternatively, the frequency changes occur in steps too small to impact the phase of the derived clock signals. For example, in a clock generation circuit using a phase-locked loop ('PLL'), the PLL output needs to be stable and not jitter. The PLL receives the reference signal as one input and a feedback signal as another input. To provide stability a filter typically is included in the feedback path. A smaller filter bandwidth tends to increase stability, but slow down the PLL's ability to track changes in the reference signal without creating jitter. A larger filter bandwidth tends to decrease stability, but increase the PLL's ability to track changes in the reference signal without creating jitter. By having a step frequency (i.e., frequency of step changes in reference signal) that is within the PLL filter's bandwidth, jitter is avoided. Accordingly a PLL output is able to vary (i.e., modulate) smoothly, even when receiving the modulating reference signal. Thus, the resulting CPU clock signal is implemented to vary smoothly, or more specifically to induce a cycle to cycle jitter for any two PLL cycles which is less than a specified constraint, such as 200 ps.

One advantage of the invention is that electromagnetic energy emissions are spread over a larger bandwidth so as to reduce their interfering capability. Specifically the EMI is reduced within the bandwidth of conventional communication receivers, such as an FM receiver. Also, measured EMI is significantly reduced. Another advantage is that such reduction is achieved for an entire system or subsystem having clocks derived from a signal undergoing the modulation method of this invention. These and other aspects and advantages of the invention will be better understood by reference to the following detailed description taken in conjunction with the accompanying drawings.

DESCRIPTION OF SPECIFIC EMBODIMENTS

Overview

Figure 1:
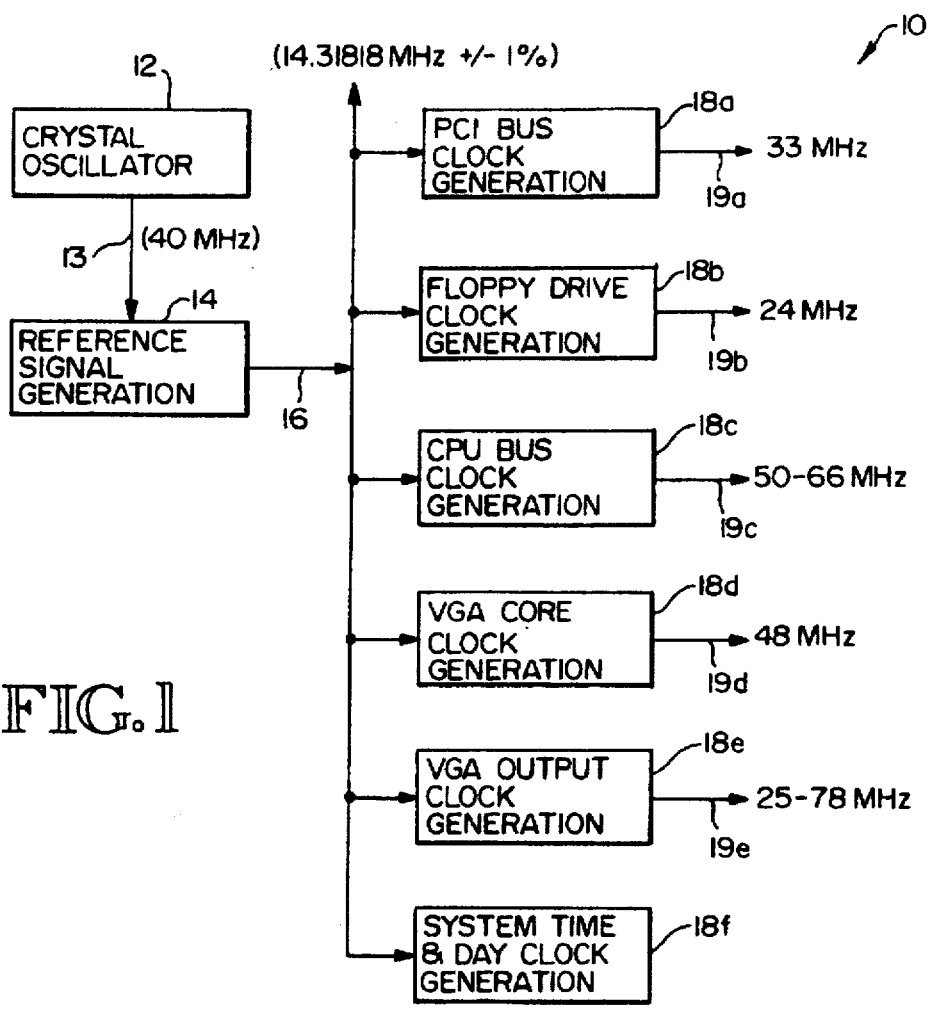
FIG. 1 is a block diagram of an apparatus for generating multiple clock signals from a common reference signal embodying the EMI reduction method of this invention.

FIG. 1 shows a block diagram of a clock signal generation apparatus 10 for use in a computer system according to an embodiment of this invention. Digital computing systems typically include circuits operating at differing clock frequencies. Rather than create each signal from its own unique source (e.g., individual crystal oscillator), it is preferred that various clock signals be derived from as few reference sources as possible. For example, a single crystal oscillator may be included for a given computer or for each digital computing board in the computer (e.g., main processor board, graphics board, video board). The reference clock frequency of a given crystal oscillator is then used to derive all the various clock signals needed on the board or in the computer. FIG. 1 shows a crystal oscillator 12 generating a 40 MHz signal into a reference signal generator 14. The reference signal generator 14 outputs a modulated reference signal 16 for input to multiple clock signal generator circuits 18. The respective clock signal generator circuits 18 derive clock signals at desired frequencies using conventional phase-locked loop and frequency synthesis techniques and/ or other techniques, such as the dithering technique disclosed in the related application incorporated herein by reference, (see above section on cross reference to related applications).

In one embodiment the desired reference clock frequency is 14.31818 MHz. According to one aspect of the invention, such reference frequency is digitally derived from a 40 MHz base signal. The 14.31818 MHz signal serves as the desired frequency about which an actual reference signal is ramped up and down. Such ramping occurs in periodic fashion at a prescribed modulation frequency. A frequency modulator varies the desired reference signal by a desired degree. In one embodiment, the desired reference signal is modulated by +/−1%, although other ranges are used in alternative embodiments. In the exemplary embodiment, the modulated reference signal 16 is ramped up approximately 1% faster than the 14.31818 MHz frequency and ramped down approximately 1% slower than the 14.31818 MHz frequency. In various embodiments the percentage variation (e.g., +/−1%) differs according to accuracy, jitter and rated frequency specifications of clock signals to be derived from the modulated reference signal 16. Exemplary ranges are between +/−0.1% and +/−2.5%, although smaller and larger ranges also may be used according to implementation requirements.

The ramping up and down about the desired reference frequency is performed in periodic fashion. In one embodiment, the modulation frequency is 31.46 kHz. By modulating the reference frequency the electromagnetic interference (EMI) emissions are spread over a frequency range. More specifically, the energy does not occur only at the desired frequency (e.g., 14.31818 MHz). The energy occurs, for the +/−1% example, over a frequency range of 14.17500 MHz to 14.46136 MHz. This +/−1% band corresponds to a range of approximately 286.4 kHz. EMI emissions typically are undesirable for a 120 kHz band because such band is used in conventional communication receivers. By spreading the band over a larger frequency range, the same amount of energy is spread over a larger bandwidth. Thus, the energy within the 120 KHz bandwidth of interest is reduced, thereby reducing the interference with various radio or other signals of concern.

By defining the ramping change of the reference, signal over a triangular waveform, the energy spreading is generally uniform over the frequency band (e.g., the +/−1% =286.4 kHz band). Thus, undesired EMI emissions within the 120 kHz bandwidth are substantially reduced. Note, that a CPU clock operating at 400 MHz which is derived from the 14.318 signal has EMI energy spread over an 8 MHz range, (i.e., 2% * 400 MHz=8 Mhz). Thus, instead of all the EMI emissions for the 400 MHz signal occurring at 400 MHz, the emissions are spread over an 8 MHz range, (e.g., 396 MHz–404 MHz). More significantly, the spreading occurs over a band broader than the 120 kHz band of import. Further, the EMI emissions of interest (e.g., those within the 120 kHz band) are reduced to 120 kHz/8 MHz of what the emissions would be under conventional methods. This corresponds to an 18 dB reduction in measured EMI emissions.

Also consider the example where a 1 MHz signal is spread over a 0.99 MHz to 1.01 MHz bandwidth. The corresponding +/−1%=100 KHz is less than the 120 KHz bandwidth of interest. However, larger harmonics of such signals, such as a 2 Mhz signal are spread over a larger bandwidth, (e.g., 1.98 MHz to 2.02 MHz). The corresponding +/−1%=200 KHz is larger than the 120 KHz band of interest. Thus, even though the EMI for primary 1 MHz signal is not directly reduced, such spreading of the primary signal is beneficial to reduce EMI emissions of the primary signal's larger harmonics.

Modulated Reference Frequency Generation

Figure 2:
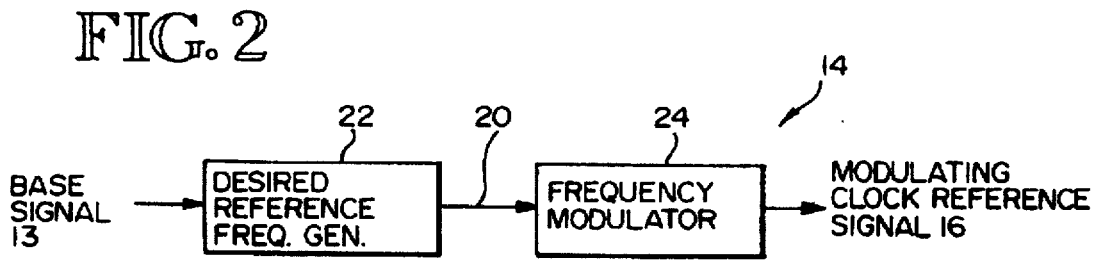
FIG. 2 is a block diagram of an apparatus for generating a modulated clock reference frequency signal according to an embodiment of this invention.

FIG. 2 shows a block diagram of an apparatus 14 for generating the modulated reference frequency according to an embodiment of this invention. A periodic base signal 13 from the crystal oscillator 12 is received into the apparatus 14. Apparatus 14 derives a desired reference signal 20 from the base signal 13, then modulates the desired reference signal 20 to create the modulated clock reference signal 16.

The base signal 13 is received at a desired reference frequency generator circuit 22. Circuit 22 generates the desired reference signal 20. Signal 20 then is input to a modulation circuit 24 which increases and decreases the desired reference frequency over a prescribed range. In an exemplary embodiment such range is +/−1%. Such variation is performed in periodic fashion. The result is the modulated clock reference signal 16 which is output to various clock signal generator circuits.

Figure 3:
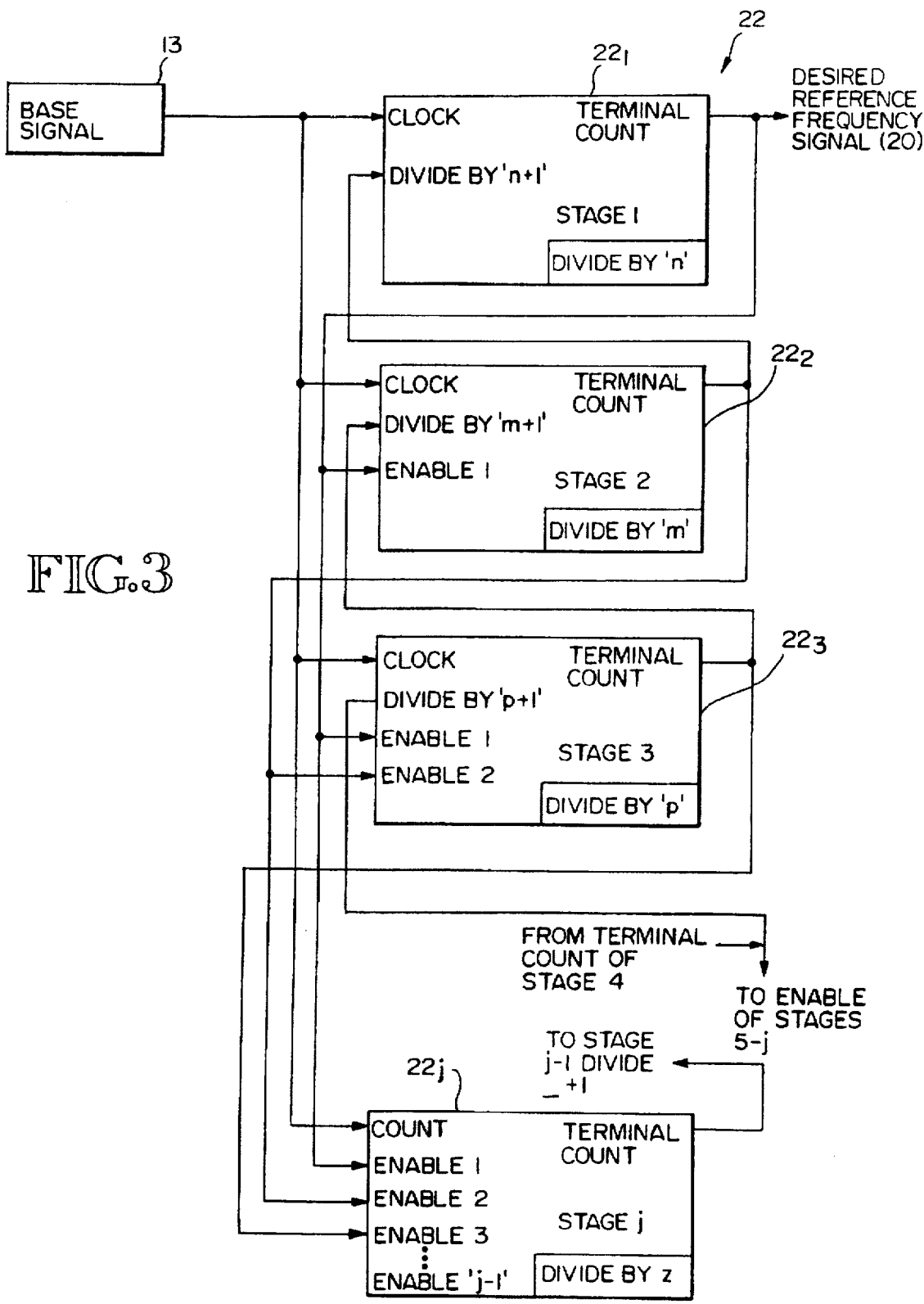
FIG. 3 is a block diagram of an apparatus for deriving a dithered reference frequency signal from a base signal.

Desired Reference Frequency Generation:

FIG. 3 shows one embodiment of the desired reference frequency generator circuit 22. The desired clock reference frequency signal 20 is derived by taking the closest corresponding transition of the base signal 13 as the desired clock reference signal 20 transition. In effect, the desired reference frequency signal is dithered. Over the long term the dithered signal averages out to the desired reference frequency signal 20. The base signal 13 is input to a chain of dividers, (e.g., part no. 74161 dividers). Each stage defines a divide by operation. Stage 1 is a divide by n operation. Stage 2 is a divide by m operation. Stage 3 is a divide by p operation. The divide-by term for each stage is defined by a partial fractional expansion of the base frequency divided by the desired reference frequency. The output signal from the first stage is the desired reference frequency signal 20. The output signal from the first stage also is fed to an enable input of each successive stage. Each subsequent stage beyond the first stage has an output signal fed back to the prior stage which adjusts the divide by count of the prior stage for one cycle. According to the preferred embodiment the output signal of each such stage increments the divide by term of the predecessor stage for one cycle. The output signal of each stage also is fed to an enable input of any subsequent stage. As a result, the first stage division is altered each time the second stage counts out. The second stage division is altered each time the third stage counts out. Thus, a pattern is defined for the desired reference frequency signal 20.

Normally the apparatus 14 generates an active transition of the desired reference signal 20 every n base signal 13 periods. This is achieved by dividing the source clock signal 12 by n at stage 1. Every m sets of n source clock signal periods, however, an active transition of the desired reference signal 16 is generated instead after n+1 base signal 13 periods. This is achieved by feeding the stage 2 output back to stage 1 to alter the divide by count from n to n+1 for one cycle. Every p sets of m count outs, however, the divide by m count is changed to divide by m+1 for one cycle. This is achieved by feeding back the stage three output back to stage 2 to alter the divide by count from m to m+1. Thus, every time stage 3 counts out m+1 is used as the number of sets of n base signal periods that occur before instead using n+1 base signal periods to generate an active transition of the desired reference signal 20. The pattern continues on for as many stages as desired. The number of stages is selected based upon the desired accuracy for the reference signal 20.

The terms for each divider stage $22_i$ (for i=1, j) are defined using a partial fractional expansion. Specifically, the desired reference frequency is divided by the base signal 13 frequency yielding an integer part and a fractional part. If there is only an integer part then the desired reference frequency is evenly divisible into the base frequency so a simple one stage division of the base signal 13 suffices. Such a case is achieved via conventional methods and apparatus. However, for a desired reference frequency which is not evenly divisible into the base signal frequency, the result is a first integer part and a first remainder part. The integer part is taken as the divide by term, 'n', for stage 1 ($22_1$). The first remainder part then is inverted yielding a second integer part and either zero remainder or a non-zero fractional remainder. The second integer is taken as the divide by term, 'm', for the second stage $22_2$. If the second remainder is 0, then all that is used is a two stage (i.e., j=2) embodiment to achieve the desired reference frequency. If there is a non-zero second fractional remainder, then such remainder is inverted yielding a third integer part and either a zero or non-zero third fractional remainder. The third integer part is taken as the divide by term, 'p' of the third stage $22_3$. If the third remainder is zero, then all that is used is a three stage (i.e., j=3) embodiment. Otherwise, the inversion and fractional expansion continues out to a desired number of stages or until a zero remainder is achieved. Note that even when there is a non-zero remainder, one may discontinue the expansion and not define any more divide-by terms. The number of stages 22 is determine by the accuracy desired for the desired reference frequency signal.

Figure 4:
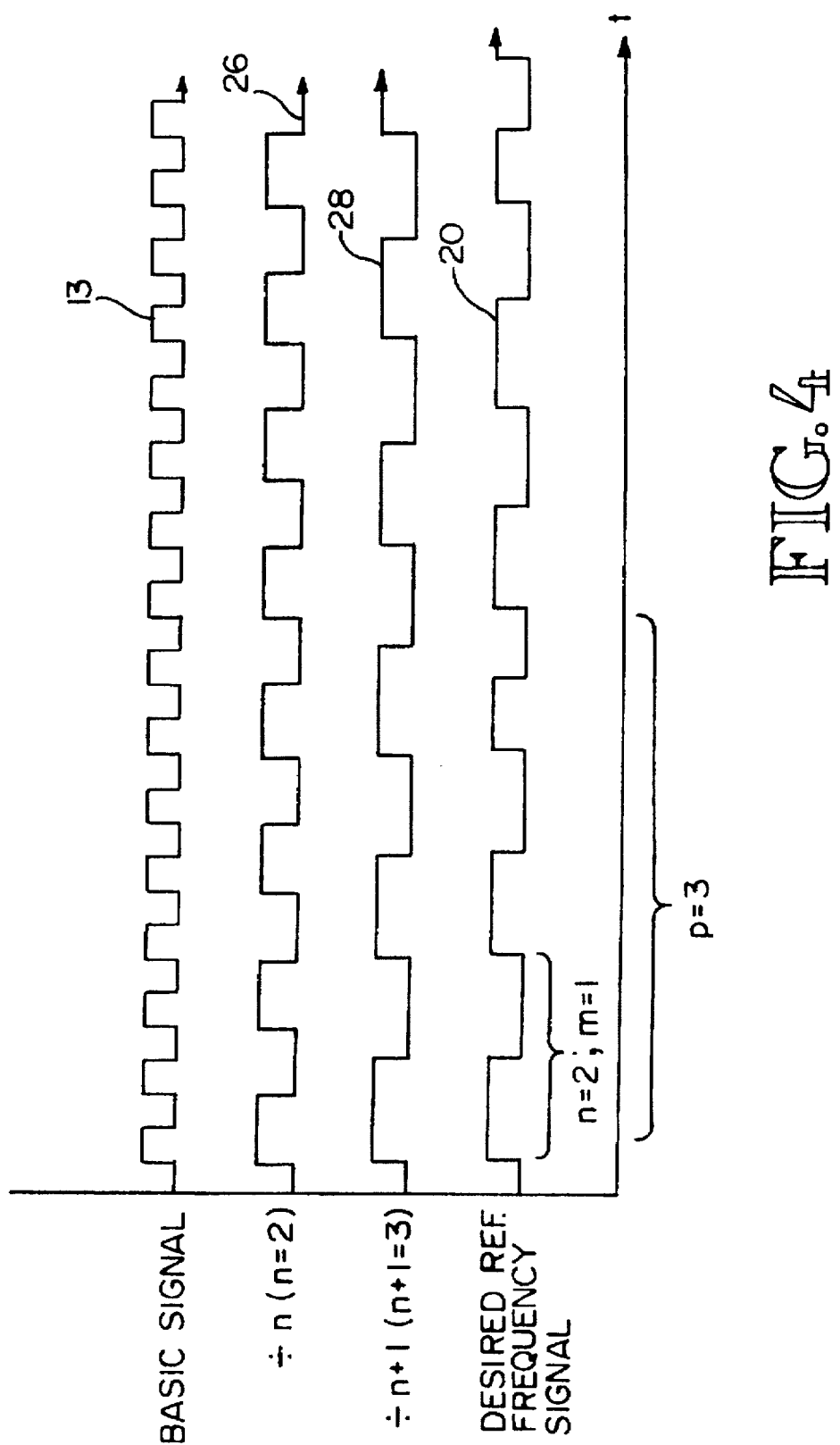
FIG. 4 is a chart of waveforms showing the derivation of the reference frequency signal from the base signal for a 40 MHz base signal and 14.31818 desired reference signal.

For a 40 MHz base signal and a 14.31818 MHz desired reference frequency, the chain includes j=3 stages of dividers. The divide by terms are n=2, m=1 and p=3. Thus, for every count out of the first stage $22_1$ the second stage $22_2$ output goes active, signifying the first stage $22_1$ to instead do a divide by 3. FIG. 4 shows a divide by n=2 signal 26 and a divide by n+1=3 signal 28. Factoring in the third stage $22_3$, there is a third divide by term, p=3. Thus, every third count out of the second stage $22_2$, the divide by count changes from 1 to 2. The resulting desired reference frequency signal 20 also is shown in FIG. 4. Note the pattern in which the desired reference frequency signal 20 dithers between a divide by 3 and a divide by 2 of the base signal 13.

Modulation of the Desired Reference Frequency:

Referring again to FIG. 2, the desired reference frequency signal 20 is modulated at modulator 24 by ramping the frequency up and down about the desired reference frequency. In one embodiment the modulator is embodied in a programmable logic array (PAL). The PAL is programmed to embody flip-flops and other conventional logic for modulating a signal by a desired percentage over a desired modulation period. In a preferred embodiment, the modulator 24 produces a triangular modulation waveform. An advantage of a triangular waveform is that the waveform varies uniformly. In one embodiment, the modulator 24 ramps the reference frequency up by approximately 1% and down by approximately 1%. As a result, the actual reference frequency signal 16 generated has a frequency varying by +/−1%. In one embodiment, the carrier signal has a frequency of 31.46 kHz. Thus, the modulation period is 31.786 microseconds, (i.e., 1/31.460). The specific carrier frequency and the per cent variation of the desired reference relative time position within a modulation waveform period. Thus, pixels are slightly closer together at one portion of the line and slightly farther apart at another portion of the line, but the pixels are still aligned vertically and horizontally.

Another concern in generating the modulation waveform is that frequencies vary uniformly or in small steps so as to avoid adverse jitter in, for example a CPU clock. A PENTIUM™ processor, for example requires jitter to be less than 200 ps. Thus a CPU clock generated from the modulated reference signal 16 must operate within such jitter requirement. One manner of complying is to smoothly vary the reference signal frequency so that the cycle to cycle jitter is less than 200 ps. Another method for complying is to have the reference signal frequency change in steps too small to destabilize the PLL circuit from which the CPU clock is derived.

Figure 6:
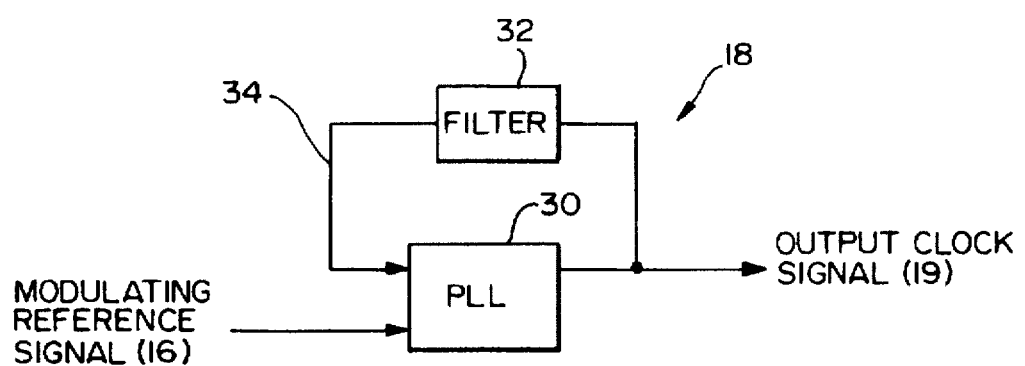
FIG. 6 is a block diagram of a clock generation circuit receiving the modulating reference signal of FIG. 5.

Referring to FIG. 6, a CPU clock signal generating circuit 18 includes a phase-locked loop circuit ('PLL') 30 and a filter 32. The PLL 30 receives the reference signal 16 at one input and a feedback signal 34 at another input. The filter 32 serves to provide stability to the output clock signal 19. A filter 32 having a smaller bandwidth tends to increase stability, but slow down the PLL's ability to track changes in the reference signal without creating jitter. Increasing the filter 32 bandwidth tends to decrease stability, but increase the PLL's ability to track changes in the reference signal without creating jitter. By having a step frequency (i.e., frequency of step changes in reference signal) that is within the PLL filter's bandwidth, jitter is avoided. Accordingly PLL 30 output is able to vary (i.e., modulate) smoothly, even when receiving the modulating reference signal. Thus, the resulting CPU clock signal 19 is implemented to vary smoothly, or more specifically to induce a cycle to cycle jitter for any two PLL cycles which is less than a specified constraint, such as 200 ps.

Clock Signal Generation and EMI Reduction in Clock Signals

Figure 5:
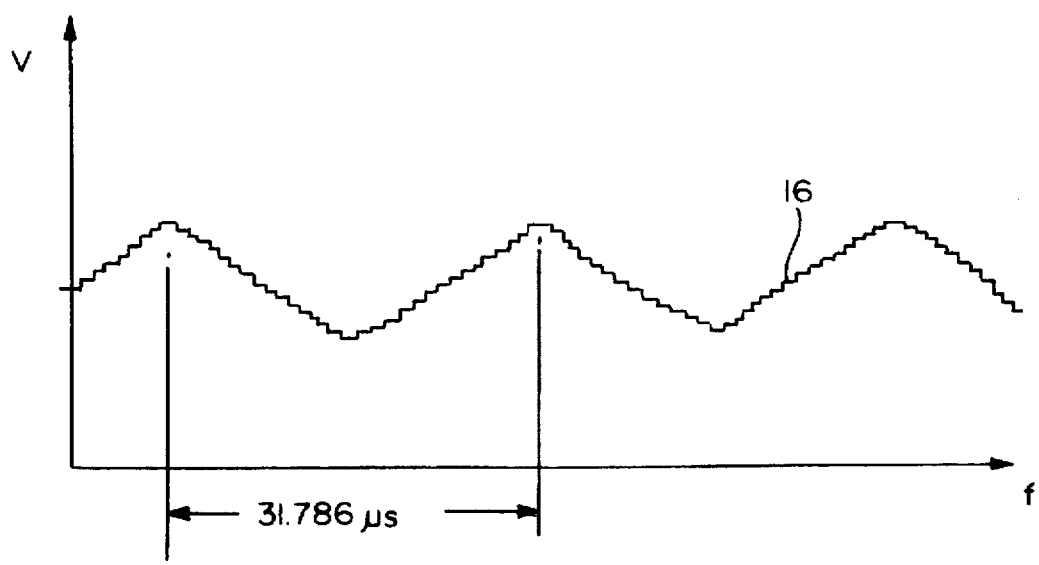
FIG. 5 is a chart of a modulating reference signal according to an embodiment of this invention.

Referring again to FIG. 1 each one of multiple clock generation circuits 18 receives the modulated reference signal 16. The clock generation circuits 18 generate various system clock signals for a given digital computer system. In the embodiment illustrated, clock signals are generated for a PCI bus, floppy disk drive, CPU bus, VGA core electronics, VGA output frequency and system timer. In one embodiment such clock frequency varies in other embodiments. FIG. 5 shows a chart of the modulating clock reference signal 16.

By modulating the reference frequency the electromagnetic interference (EMI) emissions are spread over an expanded frequency range. Thus, the EMI energy does not occur only at the desired reference frequency (e.g., 14.31818 Mhz), but is spread between 14.17500 MHz and 14.46136 MHz, (e.g., 14.31818 MHz+/−1%). This corresponds to a range of approximately 286.4 kHz, which is more than double the 120 kHz range. For a triangular wave carrier, the energy is generally uniform over the 286.4 kHz range. Thus, measured EMI emissions are substantially reduced. Further EMI emissions for larger harmonics and specific smaller harmonics of the reference frequency also are reduced.

A challenge in reducing EMI emissions by modulating a reference signal is to meet jitter and accuracy requirements of derived clock signals. A CPU clock for example requires a cycle-to-cycle jitter of less than 200 pico-seconds, according to one conventional standard. As another example, a display output frequency deviation of even 1% will cause characters to appear blurry or smeared. As still another example, a system timer which maintains the time and date is required to be accurate within 1 part per million. Thus, digital clocks are required to be stable and easy to produce. Analog approaches toward spreading the energy to reduce measured EMI emissions are unable to meet such challenges. The method of this invention, however, is able to spread the emissions without adversely impacting the jitter and accuracy requirements of the system clock signals.

Although the modulation waveform frequency varies in differing embodiments, in one embodiment a 31.46 kHz modulation frequency is selected so that the corresponding modulation wavefrom period matches the horizontal retrace period of a display device. Specifically, display device output clocks have a need to avoid jitter so as to enable clear images to be formed on the display screen. The expected adverse impacts expected when modulating a VGA output clock, for example, are overcome by using a modulation frequency matching the horizontal retrace time of the display device. Of importance to the display device is that the display pixels line up vertically and horizontally. Varying the VGA output frequency might cause misalignment and thus blurry images. However, by matching the modulation frequency to the horizontal retrace frequency, each line scanned onto the display device starts at the same signals are generated conventionally using phase-locked loop and frequency synthesis techniques to achieve the desired clock signals. For example, the modulated reference signal is divided down to various intermediary signals. Multiple periods of respective intermediary signals then are combined to multiply up to a desired frequency greater than the reference frequency.

In an alternative embodiment, a dithering technique is used to divide the modulated reference signal instead of using a phase-locked loop technique. Such dithering is described above with regard to the generation of the desired reference frequency signal 20.

Meritorious and Advantageous Effects

One advantage of the invention is that electromagnetic energy emissions are spread over a larger bandwidth so as to reduce their interfering capability. Specifically the adverse EMI emissions are significantly reduced. Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method for reducing electromagnetic interference emissions in a digital system, comprising the steps of:

digitally deriving a reference frequency signal from an unmodulated base signal having a base signal frequency and a base signal period by frequency dividing the base signal, wherein the reference frequency signal approximates a desired frequency which is not evenly divisible into the base signal frequency, and wherein the reference frequency signal dithers by having a varying period which changes between a first number of base signal periods and either one of an increment or decrement of the first number, the reference frequency signal period changing between the first number and the increment or decrement of the first number in a repeating pattern, wherein the repeating pattern is defined to have each active transition of the reference frequency signal occur at a base signal transition which most closely approximates a transition at the desired frequency;

after the step of digitally deriving, modulating the reference frequency signal to vary in a periodic manner between within a first frequency band having an upper frequency limit and a lower frequency limit to achieve a modulating reference signal; and generating a clock signal from the modulating reference signal, wherein the clock signal has a clock signal frequency which varies within a second frequency band; and wherein electromagnetic interference emissions of the modulating reference signal are spread over the first frequency band and wherein electromagnetic interference emissions of the generated clock signal are spread over the second frequency band.

2. The method of claim 1 in which the step of modulating the reference frequency signal defines a modulation period matching horizontal retrace period of a display device receiving said generated clock signal.

3. The method of claim 1 in which the modulating reference signal frequency varies by incremental steps, said step variation occurring at a step frequency within a bandwidth of a filter of a CPU clock generation circuit receiving the modulating reference signal, wherein the CPU clock generation circuit receives an input signal and generates an output signal, and wherein the filter serves to stabilize the output signal for input signal frequency changes occurring at a rate within the filter bandwidth, wherein the modulating reference signal is the input signal and the step frequency is the rate at which input signal changes occur.

4. The method of claim 1 in which the modulating reference signal exhibits a triangular modulation waveform.

5. The method of claim 1 in which at least one of the generated clock signal and the modulated reference signal exhibits a harmonic, and in which at least one among the modulating reference signal, the generated clock signal and the exhibited harmonic have electromagnetic interference emissions spread over more than a 120 kHz bandwidth.

6. The method of claim 1 in which the upper frequency limit and the lower frequency limit define a bandwidth of not more than 5% of a center frequency between such upper frequency limit and lower frequency limit.

7. The method of claim 6 in which the modulating reference signal exhibits a harmonic, and at least one of the first frequency band and a corresponding frequency band of the harmonic have electromagnetic interference emissions spread more than a 120 kHz bandwidth.

8. The method of claim 1, in which the step of generating comprises generating a plurality of clock signals from the modulating reference signal; and wherein electromagnetic interference emissions from at least one of the plurality of generated clock signals is spread over a frequency band spanning more than 120 Khz.

9. The method of claim 1, in which the step of digitally deriving comprises:

inputting the base signal into a frequency divider, the frequency divider receiving a divide-by parameter signal which defines a number of base signal periods which form a reference signal period;

varying the divide-by parameter between a first number and either one of an increment or decrement of the first number in a repeating pattern, wherein the repeating pattern is prescribed so that each active transition of the reference frequency signal relative to a start time of the repeating pattern occurs at a base signal transition which most closely approximates a transition relative to the start time at the desired reference frequency.

10. A method for reducing electromagnetic interference emissions in a digital system, comprising the steps of:

digitally deriving a reference frequency signal from an unmodulated base signal having a base signal frequency and a base signal period by frequency dividing the base signal, wherein the reference frequency signal approximates a desired frequency which is not evenly divisible into the base signal frequency, and wherein the reference frequency signal dithers by having a varying period which changes between a first number of base signal periods and either one of an increment or decrement of the first number, the reference frequency Signal period changing between the first number and the increment or decrement of the first number in a repeating pattern, wherein the repeating pattern is defined to have each active transition of the reference frequency signal occur at a base signal transition which most closely approximates a transition at the desired frequency;

after the step of digitally deriving, modulating frequency of the reference frequency signal to vary in a periodic manner between an upper frequency limit and a lower frequency limit to generate a modulating reference signal, in which frequency of the modulating reference signal varies by incremental steps, and in which said step variation occurs at a step frequency within a bandwidth of a filter of a CPU clock generation circuit receiving the modulating reference signal, wherein the CPU clock generation circuit receives an input signal and generates an output signal, and wherein the filter serves to stabilize the output signal for input signal frequency changes occurring at a rate within the filter bandwidth, wherein the modulating reference signal is the input signal and the step frequency is the rate at which input signal changes occur; and wherein electromagnetic interference emissions of the modulating reference signal are spread over a frequency band; and wherein the upper frequency limit and the lower frequency limit define a bandwidth of not more than 5% of a center frequency between such upper frequency limit and lower frequency limit, and in which the modulating reference signal exhibits a harmonic, and in which at least one of the modulating reference signal and the exhibited harmonic have electromagnetic interference emissions spread over more than a 120 kHz bandwidth.

11. A method for reducing electromagnetic interference emissions in a digital system, comprising the steps of:

digitally deriving a reference frequency signal from an unmodulated base signal having a base signal frequency and a base signal period by frequency dividing the base signal, wherein the reference frequency signal approximates a desired frequency which is not evenly divisible into the base signal frequency, and wherein the reference frequency signal dithers by having a varying period which changes between a first number of base signal periods and either one of an increment or decrement of the first number, the reference frequency signal period changing between the first number and the increment or decrement of the first number in a repeating pattern, wherein the repeating pattern is defined to have each active transition of the reference frequency signal occur at a base signal transition which most closely approximates a transition at the desired frequency;

after the step of digitally deriving, modulating the reference frequency signal to vary in a periodic manner between an upper frequency limit and a lower frequency limit to achieve a modulating reference signal, the upper frequency limit and lower frequency limit defining a first frequency band having the desired frequency as a center frequency and having a bandwidth spanning more than 120 kHz; and generating a clock signal from the modulating reference signal, wherein the clock signal has a clock signal frequency which varies within a second frequency band spanning more than 120 Khz; and wherein electromagnetic interference emissions of the modulating reference signal are spread over the first frequency band; and wherein electromagnetic interference emissions of the generated clock signal are spread over the second frequency band.

12. The method of claim 11, further comprising prior to the step of digitally deriving, the step of generating the base signal at a crystal oscillator.

13. The method of claim 11, in which the step of digitally deriving comprises the steps:

defining a set of divide-by terms using a partial fraction expansion of base signal frequency divided by the desired frequency; and defining the pattern for changing the reference frequency signal period as a function of the divide-by terms.

14. The method of claim 13, in which the step of defining a pattern comprises dividing the base signal frequency in a serial chain of frequency division circuitry stages, each one of the stages performing a frequency division using a divide factor defined by a corresponding one of the divide-by terms; and wherein any one stage in the serial chain other than a last stage has the divide factor altered in response to a count-out of an immediately successive stage.

15. The method of claim 13, in which there are at least two frequency division circuitry stages, in which the base signal frequency divided by the desired frequency has a first integer part and a first remainder part, an inversion of the first remainder part comprising a second integer part, and in which the step of defining a set comprises defining the first integer part as a first divide-by term and the second integer part as a second divide-by term.

16. An apparatus for reducing EMI emissions in a digitally clocked system, comprising:

a plurality of dividers receiving as a clock input a base clock signal having a base clock signal frequency and a base clock signal period, the plurality of dividers dividing the base clock signal frequency to digitally derive a dithering reference frequency signal having a reference frequency signal period which changes between a first number of base signal periods and either one of an increment or decrement of the first number, the reference frequency signal period changing between the first number and an increment or decrement of the first number in a repeating pattern, wherein the repeating pattern is defined to have each active transition of the reference frequency signal occur at a base signal transition which most closely approximates a transition at a desired frequency; wherein the reference frequency signal approximates the desired frequency, the desired frequency not evenly divisible into the base signal frequency;

a frequency modulator receiving the reference frequency signal for varying the reference frequency signal in a periodic manner between an upper frequency limit and a lower frequency limit to generate a modulating reference signal, the upper frequency limit and lower frequency limit defining a first frequency band centered at the desired frequency; and a clock generating means receiving the modulating reference signal and deriving a respective clock signal from the modulating reference signal, wherein the respective clock signal has a clock signal frequency which varies within a second frequency band; and wherein electromagnetic emissions from the modulating reference signal are spread over the first frequency band, and wherein electromagnetic emissions from the clock signal are spread over the second frequency band.

17. The apparatus of claim 16 in which at least one of the generated clock signal and the modulated reference signal exhibits a harmonic, and in which at least one among the modulating reference signal, the generated clock signal and the exhibited harmonic have electromagnetic interference emissions spread over more than a 120 kHz bandwidth; and in which the upper frequency limit and the lower frequency limit define a bandwidth of not more than 5% of the average desired frequency.

18. The apparatus of claim 17 in which the modulating reference signal exhibits a triangular modulation waveform.

19. The apparatus of claim 16, in which the plurality of dividers are serially coupled to change the reference frequency signal period between the first number of base signal periods and an increment of the first number of base signal periods, each one of the plurality of dividers having a divide-by term, a least significant one of the plurality of dividers in the series having a divide-by term equal to said first number, a next least significant one of the plurality of dividers in the series having a divide-by term equal to a second number; and wherein the base clock signal frequency divided by the desired frequency has a first integer part and a first remainder part; and wherein the first number is defined as the first integer part; and wherein an inversion of the first remainder part comprises a second integer part; and wherein the second number is equal to the second integer part.

20. The apparatus of claim 16 in which the variation of the reference frequency signal in a periodic manner between an upper frequency limit and a lower frequency limit defines a modulation period matching horizontal retrace period of a display device receiving one of the plurality of respective clock signals.

21. The apparatus of claim 16 in which the clock generating means comprises a phase-locked loop circuit and a filter, the phase-locked loop circuit receiving the modulating reference signal at a first input and generating in response an output clock signal, the output clock signal fed back through the filter to a second input to the phase-locked loop circuit; and wherein the modulating reference signal varies in incremental steps, said step variation occurring at a step frequency within a bandwidth of the filter.

* * * * *

UNITED STATES PATENT AND TRADEMARK OFFICE
CERTIFICATE OF CORRECTION

PATENT NO. : 5,736,893
APPLICATION NO. : 08/592975
DATED : April 7, 1998
INVENTOR(S) : Puckette et al.

It is certified that error appears in the above-identified patent and that said Letters Patent is hereby corrected as shown below:

Columns 1-14 should be deleted and replaced with the attached pages consisting of substitute columns 1-14.

Signed and Sealed this

Twenty-second Day of August, 2006

JON W. DUDAS
*Director of the United States Patent and Trademark Office*

United States Patent [19]
Puckette et al.

[11] Patent Number: 5,736,893
[45] Date of Patent: Apr. 7, 1998

[54] DIGITAL METHOD AND APPARATUS FOR REDUCING EMI EMISSIONS IN DIGITALLY-CLOCKED SYSTEMS

[75] Inventors: Robert B. E. Puckette, Corvallis; Preston D. Brown, Eugene, both of Oreg.

[73] Assignee: Hewlett-Packard Company, Palo Alto, Calif.

[21] Appl. No.: 592,975

[22] Filed: Jan. 29, 1996

[51] Int. Cl.$^6$ ............................................. H03D 1/04
[52] U.S. Cl. ........................ 327/551; 327/113; 327/117; 327/100; 377/47; 377/48; 364/724.01; 375/200
[58] Field of Search ................................. 327/113, 126, 327/164, 165, 172, 551, 115, 117, 552, 156, 147, 295, 166, 167, 100; 375/200, 204; 364/703, 724.01; 377/47, 48

[56] References Cited

U.S. PATENT DOCUMENTS

| | | | |
|---|---|---|---|
| 4,023,116 | 5/1977 | Alfke et al. | 331/17 |
| 4,658,406 | 4/1987 | Pappas | 377/48 |
| 4,933,890 | 6/1990 | Nuytkens et al. | 364/721 |
| 5,287,296 | 2/1994 | Bays et al. | 364/703 |
| 5,305,362 | 4/1994 | Miller | 377/48 |
| 5,426,392 | 6/1995 | Kornfeld | 327/551 |
| 5,488,627 | 1/1996 | Hardin et al. | 375/200 |
| 5,565,816 | 10/1996 | Coteus | 331/18 |

FOREIGN PATENT DOCUMENTS

| | | | |
|---|---|---|---|
| 0 163 313 | 5/1985 | European Pat. Off. | H03B 29/00 |
| 0431629 | 6/1991 | European Pat. Off. | |

OTHER PUBLICATIONS

Hardin et al., "Spread Spectrum Clock Generation for the Reduction of Radiated Emissions," IEEE Doc # 0-7803-1398; 4/94.

Primary Examiner—Timothy P. Callahan
Assistant Examiner—Dinh Lee

[57] ABSTRACT

A clock reference frequency is digitally derived from a base signal, then digitally modulated by ramping the clock reference frequency up and down about a desired frequency. The modulation occurs in periodic fashion at a prescribed modulation frequency. Such modulation spreads the electromagnetic energy of the system signals over a band that is a portion of the desired clock frequency. As a result, energy in harmonics of the respective system signals also are spread. When the energy spreading of any system signal or harmonic of such signal occurs over a bandwidth greater than the 120 kHz bandwidth of conventional communication receivers, adverse EMI emissions are reduced.

21 Claims, 4 Drawing Sheets

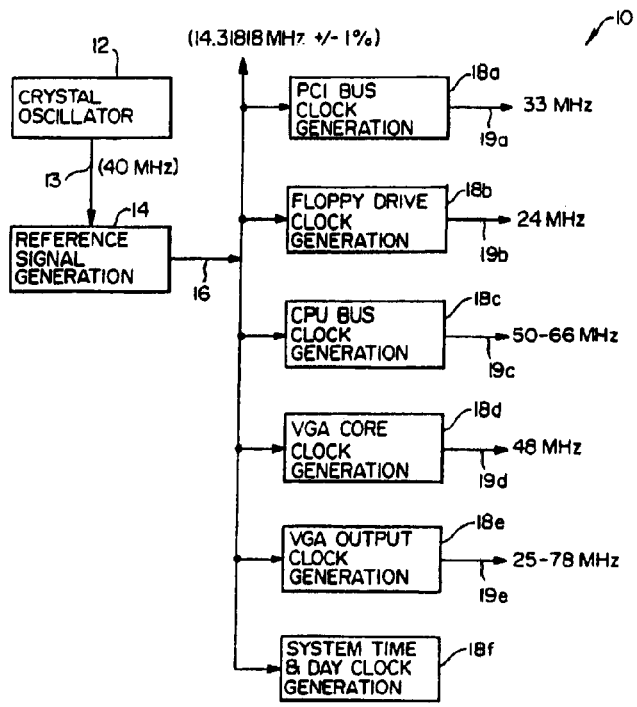

DIGITAL METHOD AND APPARATUS FOR REDUCING EMI EMISSIONS IN DIGITALLY-CLOCKED SYSTEMS

REFERENCE TO RELATED APPLICATIONS

This invention is related to U.S. patent application Ser. No. 08/593,599, filed Jan. 29, 1996 for Division Of Input Frequency To Digitally Derive Arbitrary Output Frequency. The content of that application is incorporated herein by reference and made a part hereof.

BACKGROUND OF THE INVENTION

This invention relates generally to methods and apparatus for reducing electromagnetic interferences ('EMI') emissions in a digital system, and more particularly for reducing EMI emissions in a computer or other digitally-clocked system.

Electromagnetic interference is electromagnetic energy emitted from electronic devices which, either directly or indirectly, contributes to a degradation in performance of an electronic receiver or other electronic system. Poorly shielded electronic devices, for example, degrade radio and television signals resulting in audible or visible static at receivers picking up such signals. Governments typically regulate EMI emissions to enhance public use of the radio wave and other electromagnetic wave spectrums. In the United States, for example, the F.C.C. requires testing of devices and rates the devices by class according to their emissions. The United States F.C.C. Agency rates EMI emissions over a 120 kilohertz bandwidth. The 120 kHz bandwidth corresponds to the typical bandwidth of a conventional communication receiver, such as an FM receiver. Reduced EMI emissions within such bandwidth reduce the interference output perceived by a listener or viewer as, for example, static, white noise, or "ghosts."

Typical precautions taken by electronic manufacturers are to provide shielding of electronic devices to minimize EMI emissions. Computer manufacturers, for example, typically use shielded cables and shielded housings to minimize EMI emissions. This invention is directed toward a digital method and apparatus for spreading electromagnetic interference over a wide bandwidth so as to reduce the energy level within the 120 kHz bandwidth of commercial receivers.

SUMMARY OF THE INVENTION

According to the invention, EMI emissions in a digitally-clocked system are reduced by digitally modulating a reference signal. The modulating reference signal subsequently is used to derive one or more clock signals. Modulating the reference signal varies the reference signal and signals derived therefrom by a given percentage. For a reference signal modulated to vary between +/-1% of a desired reference frequency, for example, each clock signal derived therefrom also is varied by +/-1%. The +/-1% variation differs for differing embodiments according to a clock signal's accuracy, jitter and rated frequency specifications for the specific embodiment. By varying the reference signal by the exemplary +/-1%, the EMI emissions for the reference signal or any signal derived therefrom is spread over a corresponding +/-1% frequency band. In addition EMI emissions at harmonics of such derived signals also are spread over a +/-1% frequency band. Thus a 100 MHz derived signal is spread over +/-1%=2 MHz, (i.e., 99-101 MHz), while a harmonic of such signal at 200 MHZ is spread over +/-1%=4 MHz, (i.e., 198-202 Mhz).

Any signal or signal harmonic frequency band spanning more than 120 kHz spreads the EMI emission for the corresponding signal or harmonic beyond the 120 kHz band commonly used in commercial communication receivers. Accordingly, the effect of EMI emissions on commercial communication receivers is reduced. Such bandwidth also corresponds to the bandwidth used for rating EMI emissions of electronic devices in the United States. Thus, measured EMI emissions also are reduced for such signals.

According to one aspect of the invention, a clock reference signal is digitally modulated by digitally ramping the signal's frequency up and down about a desired reference frequency. The modulation occurs in periodic fashion at a prescribed modulation frequency. Such modulation spreads the electromagnetic energy of the reference signal over a band that is a small percentage of the desired reference frequency. Similarly, the electromagnetic energy for harmonics of such reference signal and signals derived from such reference signal is spread over a corresponding band (i.e., same percentage as for reference signal).

According to another aspect of the invention the energy spreading occurs for either a signal or a signal harmonic over a bandwidth greater than the 120 kHz bandwidth of interest for EMI measurement purposes. Spreading the energy uniformly over 240 kHz, for example, reduces EMI's impact and the measured EMI by a factor of two. Note that even a spread of less than 120 kHz about a given signal's frequency may result in a spreading of 120 kHz or more at harmonics of such given signal. Accordingly, overall EMI is reduced even if the frequency band for spreading energy of a given signal is less than 120 kHz. Specifically, overall EMI is reduced in such instance for significant harmonics having energy spread over a bandwidth greater than 120 kHz.

According to another aspect of the invention the reference signal to be modulated is derived from a base signal. The to-be modulated (i.e., desired) reference signal is digitally derived from the base signal by a partial fractional expansion of the base signal's frequency. Such partial fractional expansion enables generation of any arbitrary reference signal frequency. The desired reference signal is derived by taking the closest corresponding transition of the base signal as the desired reference signal transition. In effect, the output clock signal frequency is dithered. Over the long term, an average desired reference frequency is achieved which need not be evenly divided into the base signal's frequency.

According to one embodiment, the partial fractional expansion is implemented as a chain of dividers. Each divider includes a divide-by term. Each divide-by term is a term of the fractional expansion. To derive the terms, the base signal frequency is divided by the desired reference frequency. The integer part of such division is the first divider's term, (i.e., the first term). The term for the succeeding divider is derived by inverting the remainder from the first division, and assigning the integer portion as the divide-by term, (i.e., the second term). The remainder of such second division then is inverted with the integer portion taken as the third term. The expansion continues out for as many stages of dividers as desired for a given accuracy. For example, to derive a 14.31818 MHz desired reference signal from a 40 MHz base signal, the partial fractional expansion yields a first term equal to 2, a second term equal to 1 and a third term equal to 3. Such terms are assigned to a chain of dividers which receives the 40 MHz base signal. The result is an average reference signal frequency of 14.31818 MHz at the output of the first divider.

According to a preferred embodiment of the invention, a personal computer clock reference signal (e.g., the desired reference frequency signal) is ramped up by approximately 1% faster than a desired frequency and ramped down to approximately 1% slower than the desired frequency at a prescribed modulation frequency. Consider the embodiment in which a clock reference signal has a desired frequency of 14.318 MHz. By modulating such frequency by +/-1%, the reference signal varies between 14.17500 MHz and 14.46136 MHz. This represents a frequency band spanning 286.4 kHz. Thus, the reference signal EMI emissions are spread over more than double the 120 kHz range of significance, in effect reducing the adverse EMI emissions. For larger harmonics the +/-1% spread results in a frequency bandwidth even larger than the 286.4 kHz.

According to another aspect of the invention the modulation waveform is shaped to uniformly distribute the frequency variation of the reference signal. Thus, when a signal's energy is spread over more than double the 120 kHz range, the EMI emissions are reduced by a factor of more than two. In a preferred embodiment a triangular modulation waveform is used.

According to another aspect of the invention, one or more clock signals derived from the modulated reference signal also have a frequency which varies by the same percentage. The modulation of the reference signal moves through the clock generation circuitry receiving the reference signal. Specifically, phase-locked loop and other frequency synthesis devices are keyed to the modulating reference signal resulting in modulating clock signals. In specific embodiments, such modulated clock signals occur without altering or adding circuitry to the clock generation circuits. For a reference signal which modulates at +/-1%, one or more derived clock signals also modulate at +/-1%. For example, a 400 MHz CPU clock signal derived from the reference signal now modulates over a frequency range between 396 MHz and 404 MHz. This corresponds to an 8 MHz frequency band. Such band is substantially larger than the 120 kHz band of significance for EMI measurement. Specifically, spreading the EMI energy over 8 MHz corresponds to an 18 dB reduction in measured EMI emissions. EMI emissions are reduced for other signals derived from the modulated reference signal in the same manner.

A challenge in reducing EMI emissions by modulating a reference signal is to meet jitter and accuracy requirements of derived clock signals. A CPU clock for example requires a cycle-to-cycle jitter of less than 200 pico-seconds, according to one conventional standard. As another example, a display output frequency deviation of even 1% will cause characters to appear blurry or smeared. As still another example, a system timer which maintains the time and date is required to be accurate within 1 part per million. Thus, digital clocks are required to be stable and easy to produce. Analog approaches toward spreading the energy to reduce measured EMI emissions are unable to meet such challenges. The method of this invention, however, is able to spread the emissions without adversely impacting the jitter and accuracy requirements of the system clock signals.

According to another aspect of the invention, expected adverse impacts from modulating the VGA output clock are overcome by using a modulation frequency having a period matching the horizontal retrace time of the display device. Of importance to the display device is that the pixel placements line up vertically and horizontally. Varying the VGA output frequency might cause misalignment and thus blurry images. However, by matching the modulation frequency to the horizontal retrace frequency, each line scanned onto the display device starts at the same relative time position within a modulation waveform period. Thus, pixels are slightly closer together at one portion of the line and farther apart at another portion of the line, but the pixels are still aligned vertically and horizontally.

According to another aspect of the invention, jitter requirements are met by uniformly varying the change in frequency in the modulation waveform. Alternatively, the frequency changes occur in steps too small to impact the phase of the derived clock signals. For example, in a clock generation circuit using a phase-locked loop ('PLL'), the PLL output needs to be stable and not jitter. The PLL receives the reference signal as one input and a feedback signal as another input. To provide stability a filter typically is included in the feedback path. A smaller filter bandwidth tends to increase stability, but slow down the PLL's ability to track changes in the reference signal without creating jitter. A larger filter bandwidth tends to decrease stability, but increase the PLL's ability to track changes in the reference signal without creating jitter. By having a step frequency (i.e., frequency of step changes in reference signal) that is within the PLL filter's bandwidth, jitter is avoided. Accordingly a PLL output is able to vary (i.e., modulate) smoothly, even when receiving the modulating reference signal. Thus, the resulting CPU clock signal is implemented to vary smoothly, or more specifically to induce a cycle to cycle jitter for any two PLL cycles which is less than a specified constraint, such as 200 ps.

One advantage of the invention is that electromagnetic energy emissions are spread over a larger bandwidth so as to reduce their interfering capability. Specifically the EMI is reduced within the bandwidth of conventional communication receivers, such as an FM receiver. Also, measured EMI is significantly reduced. Another advantage is that such reduction is achieved for an entire system or subsystem having clocks derived from a signal undergoing the modulation method of this invention. These and other aspects and advantages of the invention will be better understood by reference to the following detailed description taken in conjunction with the accompanying drawings.

BRIEF DESCRIPTION OF THE DRAWINGS

FIG. 1 is a block diagram of an apparatus for generating multiple clock signals from a common reference signal embodying the EMI reduction method of this invention;

FIG. 2 is a block diagram of an apparatus for generating a modulated clock reference frequency signal according to an embodiment of this invention;

FIG. 3 is a block diagram of an apparatus for deriving a dithered reference frequency signal from a base signal;

FIG. 4 is a chart of waveforms showing the derivation of the reference frequency signal from the base signal for a 40 MHz base signal and 14.31818 desired reference signal;

FIG. 5 is a chart of a modulating reference signal according to an embodiment of this invention; and FIG. 6 is a block diagram of a clock generation circuit receiving the modulating reference signal of FIG. 5.

DESCRIPTION OF SPECIFIC EMBODIMENTS
Overview

FIG. 1 shows a block diagram of a clock signal generation apparatus 10 for use in a computer system according to an embodiment of this invention. Digital computing systems typically include circuits operating at differing clock frequencies. Rather than create each signal from its own unique source (e.g., individual crystal oscillator), it is preferred that various clock signals be derived from as few reference sources as possible. For example, a single crystal oscillator may be included for a given computer or for each digital computing board in the computer (e.g., main processor board, graphics board, video board). The reference clock frequency of a given crystal oscillator is then used to derive all the various clock signals needed on the board or in the computer. FIG. 1 shows a crystal oscillator 12 generating a 40 MHz signal into a reference signal generator 14. The reference signal generator 14 outputs a modulated reference signal 16 for input to multiple clock signal generator circuits 18. The respective clock signal generator circuits 18 derive clock signals at desired frequencies using conventional phase-locked loop and frequency synthesis techniques and/or other techniques, such as the dithering technique disclosed in the related application incorporated herein by reference, (see above section on cross reference to related applications).

In one embodiment the desired reference clock frequency is 14.31818 MHz. According to one aspect of the invention, such reference frequency is digitally derived from a 40 MHz base signal. The 14.31818 MHz signal serves as the desired frequency about which an actual reference signal is ramped up and down. Such ramping occurs in periodic fashion at a prescribed modulation frequency. A frequency modulator varies the desired reference signal by a desired degree. In one embodiment, the desired reference signal is modulated by +/=1%, although other ranges are used in alternative embodiments. In the exemplary embodiment, the modulated reference signal 16 is ramped up approximately 1% faster than the 14.31818 MHz frequency and ramped down approximately 1% slower than the 14.31818 MHz frequency. In various embodiments the percentage variation (e.g., +/-1%) differs according to accuracy, jitter and rated frequency specifications of clock signals to be derived from the modulated reference signal 16. Exemplary ranges are between +/-0.1% and +/-2.5%, although smaller and larger ranges also may be used according to implementation requirements.

The ramping up and down about the desired reference frequency is performed in periodic fashion. In one embodiment, the modulation frequency is 31.46 kHz. By modulating the reference frequency the electromagnetic interference (EMI) emissions are spread over a frequency range. More specifically, the energy does not occur only at the desired frequency (e.g., 14.31818 MHz). The energy occurs, for the +/-1% example, over a frequency range of 14.17500 MHz to 14.46136 MHz. This +/-1% band corresponds to a range of approximately 286.4 kHz. EMI emissions typically are undesirable for a 120 kHz band because such band is used in conventional communication receivers. By spreading the band over a larger frequency range, the same amount of energy is spread over a larger bandwidth. Thus, the energy within the 120 KHz bandwidth of interest is reduced, thereby reducing the interference with various radio or other signals of concern.

By defining the ramping change of the reference signal over a triangular waveform, the energy spreading is generally uniform over the frequency band (e.g., the +/-1%= 286.4 kHz band). Thus, undesired EMI emissions within the 120 kHz bandwidth are substantially reduced. Note, that a CPU clock operating at 400 MHz which is derived from the 14.318 signal has EMI energy spread over an 8 MHz range, (i.e., 2%*400 MHz=8 Mhz). Thus, instead of all the EMI emissions for the 400 MHz signal occurring at 400 MHz, the emissions are spread over an 8 MHz range, (e.g., 396 MHz-404 MHz). More significantly, the spreading occurs over a band broader than the 120 kHz band of import. Further, the EMI emissions of interest (e.g., those within the 120 kHz band) are reduced to 120 kHz/8 MHz of what the emissions would be under conventional methods. This corresponds to an 18 dB reduction in measured EMI emissions.

Also consider the example where a 1 MHz signal is spread over a 0.99 MHz to 1.01 MHz bandwidth. The corresponding +/-1%=100 KHz is less than the 120 KHz bandwidth of interest. However, larger harmonics of such signals, such as a 2 Mhz signal are spread over a larger bandwidth, (e.g., 1.98 MHz to 2.02 MHz). The corresponding +/-1%=200 KHz is larger than the 120 KHz band of interest. Thus, even though the EMI for primary 1 MHz signal is not directly reduced, such spreading of the primary signal is beneficial to reduce EMI emissions of the primary signal's larger harmonics.

Modulated Reference Frequency Generation

FIG. 2 shows a block diagram of an apparatus 14 for generating the modulated reference frequency according to an embodiment of this invention. A periodic base signal 13 from the crystal oscillator 12 is received into the apparatus 14. Apparatus 14 derives a desired reference signal 20 from the base signal 13, then modulates the desired reference signal 20 to create the modulated clock reference signal 16.

The base signal 13 is received at a desired reference frequency generator circuit 22. Circuit 22 generates the desired reference signal 20. Signal 20 then is input to a modulation circuit 24 which increases and decreases the desired reference frequency over a prescribed range. In an exemplary embodiment such range is +/-1%. Such variation is performed in periodic fashion. The result is the modulated clock reference signal 16 which is output to various clock signal generator circuits.

Desired Reference Frequency Generation:

FIG. 3 shows one embodiment of the desired reference frequency generator circuit 22. The desired clock reference frequency signal 20 is derived by taking the closest corresponding transition of the base signal 13 as the desired clock reference signal 20 transition. In effect, the desired reference frequency signal is dithered. Over the long term the dithered signal averages out to the desired reference frequency signal 20. The base signal 13 is input to a chain of dividers, (e.g., part no. 74161 dividers). Each stage defines a divide by operation. Stage 1 is a divide by n operation. Stage 2 is a divide by m operation. Stage 3 is a divide by p operation. The divide-by term for each stage is defined by a partial fractional expansion of the base frequency divided by the desired reference frequency. The output signal from the first stage is the desired reference frequency signal 20. The output signal from the first stage also is fed to an enable input of each successive stage. Each subsequent stage beyond the first stage has an output signal fed back to the prior stage which adjusts the divide by count of the prior stage for one cycle. According to the preferred embodiment the output signal of each such stage increments the divide by term of the predecessor stage for one cycle. The output signal of each stage also is fed to an enable input of any subsequent stage. As a result, the first stage division is altered each time the second stage counts out. The second stage division is altered each time the third stage counts out. Thus, a pattern is defined for the desired reference frequency signal 20.

Normally the apparatus 14 generates an active transition of the desired reference signal 20 every n base signal 13 periods. This is achieved by dividing the source clock signal 12 by n at stage 1. Every m sets of n source clock signal periods, however, an active transition of the desired reference signal 16 is generated instead after n+1 base signal 13 periods. This is achieved by feeding the stage 2 output back to stage 1 to alter the divide by count from n to n+1 for one cycle. Every p sets of m count outs, however, the divide by m count is changed to divide by m+1 for one cycle. This is achieved by feeding back the stage three output back to stage 2 to alter the divide by count from m to m+1. Thus, every time stage 3 counts out m+1 is used as the number of sets of n base signal periods that occur before instead using n+1 base signal periods to generate an active transition of the desired reference signal 20. The pattern continues on for as many stages as desired. The number of stages is selected based upon the desired accuracy for the reference signal 20.

The terms for each divider stage $22_i$ (for i=1, j) are defined using a partial fractional expansion. Specifically, the desired reference frequency is divided by the base signal 13 frequency yielding an integer part and a fractional part. If there is only an integer part then the desired reference frequency is evenly divisible into the base frequency so a simple one stage division of the base signal 13 suffices. Such a case is achieved via conventional methods and apparatus. However, for a desired reference frequency which is not evenly divisible into the base signal frequency, the result is a first integer part and a first remainder part. The integer part is taken as the divide by term, 'n', for stage 1 ($22_1$). The first remainder part then is inverted yielding a second integer part and either zero remainder or a non-zero fractional remainder. The second integer is taken as the divide by term, 'm', for the second stage $22_2$. If the second remainder is 0, then all that is used is a two stage (i.e., j=2) embodiment to achieve the desired reference frequency. If there is a non-zero second fractional remainder, then such remainder is inverted yielding a third integer part and either a zero or non-zero third fractional remainder. The third integer part is taken as the divide by term, 'p' of the third stage $22_3$. If the third remainder is zero, then all that is used is a three stage (i.e., j=3) embodiment. Otherwise, the inversion and fractional expansion continues out to a desired number of stages or until a zero remainder is achieved. Note that even when there is a non-zero remainder, one may discontinue the expansion and not define any more divide-by terms. The number of stages 22 is determine by the accuracy desired for the desired reference frequency signal.

For a 40 MHz base signal and a 14.31818 MHz desired reference frequency, the chain includes j=3 stages of dividers. The divide by terms are n=2, m=1 and p=3. Thus, for every count out of the first stage $22_1$, the second stage $22_2$ output goes active, signifying the first stage $22_1$ to instead do a divide by 3. FIG. 4 shows a divide by n=2 signal 26 and a divide by n+1=3 signal 28. Factoring in the third stage $22_3$, there is a third divide by term, p=3. Thus, every third count out of the second stage $22_2$, the divide by count changes from 1 to 2. The resulting desired reference frequency signal 20 also is shown in FIG. 4. Note the pattern in which the desired reference frequency signal 20 dithers between a divide by 3 and a divide by 2 of the base signal 13.

Modulation of the Desired Reference Frequency:

Referring again to FIG. 2, the desired reference frequency signal 20 is modulated at modulator 24 by ramping the frequency up and down about the desired reference frequency. In one embodiment the modulator is embodied in a programmable logic array (PAL). The PAL is programmed to embody flip-flops and other conventional logic for modulating a signal by a desired percentage over a desired modulation period. In a preferred embodiment, the modulator 24 produces a triangular modulation waveform. An advantage of a triangular waveform is that the waveform varies uniformly. In one embodiment, the modulator 24 ramps the reference frequency up by approximately 1% and down by approximately 1%. As a result, the actual reference frequency signal 16 generated has a frequency varying by +/−1%. In one embodiment, the carrier signal has a frequency of 31.46 kHz. Thus, the modulation period is 31.786 microseconds, (i.e., 1/31,460). The specific carrier frequency and the percent variation of the desired reference frequency varies in other embodiments. FIG. 5 shows a chart of the modulating clock reference signal 16.

By modulating the reference frequency the electromagnetic interference (EMI) emissions are spread over an expanded frequency range. Thus, the EMI energy does not occur only at the desired reference frequency (e.g., 14.31818 Mhz), but is spread between 14.17500 MHz and 14.46136 MHz, (e.g., 14.31818 MHz +/−1%). This corresponds to a range of approximately 286.4 kHz, which is more than double the 120 kHz range. For a triangular wave carrier, the energy is generally uniform over the 286.4 kHz range. Thus, measured EMI emissions are substantially reduced. Further EMI emissions for larger harmonics and specific smaller harmonics of the reference frequency also are reduced.

A challenge in reducing EMI emissions by modulating a reference signal is to meet jitter and accuracy requirements of derived clock signals. A CPU clock for example requires a cycle-to-cycle jitter of less than 200 pico-seconds, according to one conventional standard. As another example, a display output frequency deviation of even 1% will cause characters to appear blurry or smeared. As still another example, a system timer which maintains the time and date is required to be accurate within 1 part per million. Thus, digital clocks are required to be stable and easy to produce. Analog approaches toward spreading the energy to reduce measured EMI emissions are unable to meet such challenges. The method of this invention, however, is able to spread the emissions without adversely impacting the jitter and accuracy requirements of the system clock signals.

Although the modulation waveform frequency varies in differing embodiments, in one embodiment a 31.46 kHz modulation frequency is selected so that the corresponding modulation wave from matching the horizontal retrace period of a display device. Specifically, display device output clocks have a need to avoid jitter so as to enable clear images to be formed on the display screen. The expected adverse impacts expected when modulating a VGA output clock, for example, are overcome by using a modulation frequency matching the horizontal retrace time of the display device. Of importance to the display device is that the display pixels line up vertically and horizontally. Varying the VGA output frequency might cause misalignment and thus blurry images. However, by matching the modulation frequency to the horizontal retrace frequency, each line scanned onto the display device starts at the same relative time position within a modulation waveform period. Thus, pixels are slightly closer together at one portion of the line and slightly farther apart at another portion of the line, but the pixels are still aligned vertically and horizontally.

Another concern in generating the modulation waveform is that frequencies vary uniformly or in small steps so as to avoid adverse jitter in, for example a CPU clock. A PENTIUM™ processor, for example requires jitter to be less than 200 ps. Thus a CPU clock generated from the modulated reference signal 16 must operate within such jitter requirement. One manner of complying is to smoothly vary the reference signal frequency so that the cycle to cycle jitter is less than 200 ps. Another method for complying is to have the reference signal frequency change in steps too small to destabilize the PLL circuit from which the CPU clock is derived.

Referring to FIG. 6, a CPU clock signal generating circuit 18 includes a phase-locked loop circuit ('PLL') 30 and a filter 32. The PLL 30 receives the reference signal 16 at one input and a feedback signal 34 at another input. The filter 32 serves to provide stability to the output clock signal 19. A filter 32 having a smaller bandwidth tends to increase stability, but slow down the PLL's ability to track changes in the reference signal without creating jitter. Increasing the filter 32 bandwidth tends to decrease stability, but increase the PLL's ability to track changes in the reference signal without creating jitter. By having a step frequency (i.e., frequency of step changes in reference signal) that is within the PLL filter's bandwidth, jitter is avoided. Accordingly PLL 30 output is able to vary (i.e., modulate) smoothly, even when receiving the modulating reference signal. Thus, the resulting CPU clock signal 19 is implemented to vary smoothly, or more specifically to induce a cycle to cycle jitter for any two PLL cycles which is less than a specified constraint, such as 200 ps.

Clock Signal Generation and EMI Reduction in Clock Signals

Referring again to FIG. 1 each one of multiple clock generation circuits 18 receives the modulated reference signal 16. The clock generation circuits 18 generate various system clock signals for a given digital computer system. In the embodiment illustrated, clock signals are generated for a PCI bus, floppy disk drive, CPU bus, VGA core electronics, VGA output frequency and system timer. In one embodiment such clock signals are generated conventionally using phase-locked loop and frequency synthesis techniques to achieve the desired clock signals. For example, the modulated reference signal is divided down to various intermediary signals. Multiple periods of respective intermediary signals then are combined to multiply up to a desired frequency greater than the reference frequency.

In an alternative embodiment, a dithering technique is used to divide the modulated reference signal instead of using a phase-locked loop technique. Such dithering is described above with regard to the generation of the desired reference frequency signal 20.

Meritorious and Advantageous Effects

One advantage of the invention is that electromagnetic energy emissions are spread over a larger bandwidth so as to reduce their interfering capability. Specifically the adverse EMI emissions are significantly reduced. Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method for reducing electromagnetic interference emissions in a digital system, comprising the steps of:

digitally deriving a reference frequency signal from an unmodulated base signal having a base signal frequency and a base signal period by frequency dividing the base signal, wherein the reference frequency signal approximates a desired frequency which is not evenly divisible into the base signal frequency, and wherein the reference frequency signal dithers by having a varying period which changes between a first number of base signal periods and either one of an increment or decrement of the first number, the reference frequency signal period changing between the first number and the increment or decrement of the first number in a repeating pattern, wherein the repeating pattern is defined to have each active transition of the reference frequency signal occur at a base signal transition which most closely approximates a transition at the desired frequency;

after the step of digitally deriving, modulating the reference frequency signal to vary in a periodic manner between within a first frequency band having an upper frequency limit and a lower frequency limit to achieve a modulating reference signal; and generating a clock signal from the modulating reference signal, wherein the clock signal has a clock signal frequency which varies within a second frequency band; and wherein electromagnetic interference emissions of the modulating reference signal are spread over the first frequency band and wherein electromagnetic interference emissions of the generated clock signal are spread over the second frequency band.

2. The method of claim 1 in which the step of modulating the reference frequency signal defines a modulation period matching horizontal retrace period of a display device receiving said generated clock signal.

3. The method of claim 1 in which the modulating reference signal frequency varies by incremental steps, said step variation occurring at a step frequency within a bandwidth of a filter of a CPU clock generation circuit receiving the modulating reference signal, wherein the CPU clock generation circuit receives an input signal and generates an output signal, and wherein the filter serves to stabilize the output signal for input signal frequency changes occurring at a rate within the filter bandwidth, wherein the modulating reference signal is the input signal and the step frequency is the rate at which input signal changes occur.

4. The method of claim 1 in which the modulating reference signal exhibits a triangular modulation waveform.

5. The method of claim 1 in which at least one of the generated clock signal and the modulated reference signal exhibits a harmonic, and in which at least one among the modulating reference signal, the generated clock signal and the exhibited harmonic have electromagnetic interference emissions spread over more than a 120 kHz bandwidth.

6. The method of claim 1 in which the upper frequency limit and the lower frequency limit define a bandwidth of not more than 5% of a center frequency between such upper frequency limit and lower frequency limit.

7. The method of claim 6 in which the modulating reference signal exhibits a harmonic, and at least one of the first frequency band and a corresponding frequency band of the harmonic have electromagnetic interference emissions spread more than a 120 kHz bandwidth.

8. The method of claim 1, in which the step of generating comprises generating a plurality of clock signals from the modulating reference signal; and wherein electromagnetic interference emissions from at least one of the plurality of generated clock signals is spread over a frequency band spanning more than 120 Khz.

9. The method of claim 1, in which the step of digitally deriving comprises:

inputting the base signal into a frequency divider, the frequency divider receiving a divide-by parameter signal which defines a number of base signal periods which form a reference signal period;

varying the divide-by parameter between a first number and either one of an increment or decrement of the first number in a repeating pattern, wherein the repeating pattern is prescribed so that each active transition of the reference frequency signal relative to a start time of the repeating pattern occurs at a base signal transition which most closely approximates a transition relative to the start time at the desired reference frequency.

10. A method for reducing electromagnetic interference emissions in a digital system, comprising the steps of:

digitally deriving a reference frequency signal from an unmodulated base signal having a base signal frequency and a base signal period by frequency dividing the base signal, wherein the reference frequency signal approximates a desired frequency which is not evenly divisible into the base signal frequency, and wherein the reference frequency signal dithers by having a varying period which changes between a first number of base signal periods and either one of an increment or decrement of the first number, the reference frequency signal period changing between the first number and the increment or decrement of the first number in a repeating pattern, wherein the repeating pattern is defined to have each active transition of the reference frequency signal occur at a base signal transition which most closely approximates a transition at the desired frequency;

after the step of digitally deriving, modulating frequency of the reference frequency signal to vary in a periodic manner between an upper frequency limit and a lower frequency limit to generate a modulating reference signal, in which frequency of the modulating reference signal varies by incremental steps, and in which said step variation occurs at a step frequency within a bandwidth of a filter of a CPU clock generation circuit receiving the modulating reference signal, wherein the CPU clock generation circuit receives an input signal and generates an output signal, and wherein the filter serves to stabilize the output signal for input signal frequency changes occurring at a rate within the filter bandwidth, wherein the modulating reference signal is the input signal and the step frequency is the rate at which input signal changes occur; and wherein electromagnetic interference emissions of the modulating reference signal are spread over a frequency band; and wherein the upper frequency limit and the lower frequency limit define a bandwidth of not more than 5% of a center frequency between such upper frequency limit and lower frequency limit, and in which the modulating reference signal exhibits a harmonic, and in which at least one of the modulating reference signal and the exhibited harmonic have electromagnetic interference emissions spread over more than a 120 kHz bandwidth.

11. A method for reducing electromagnetic interference emissions in a digital system, comprising the steps of:

digitally deriving a reference frequency signal from an unmodulated base signal having a base signal frequency and a base signal period by frequency dividing the base signal, wherein the reference frequency signal approximates a desired frequency which is not evenly divisible into the base signal frequency, and wherein the reference frequency signal dithers by having a varying period which changes between a first number of base signal periods and either one of an increment or decrement of the first number, the reference frequency signal period changing between the first number and the increment or decrement of the first number in a repeating pattern, wherein the repeating pattern is defined to have each active transition of the reference frequency signal occur at a base signal transition which most closely approximates a transition at the desired frequency;

after the step of digitally deriving, modulating the reference frequency signal to vary in a periodic manner between an upper frequency limit and a lower frequency limit to achieve a modulating reference signal, the upper frequency limit and lower frequency limit defining a first frequency band having the desired frequency as a center frequency and having a bandwidth spanning more than 120 kHz; and generating a clock signal from the modulating reference signal, wherein the clock signal has a clock signal frequency which varies within a second frequency band spanning more than 120 Khz; and wherein electromagnetic interference emissions of the modulating reference signal are spread over the first frequency band; and wherein electromagnetic interference emissions of the generated clock signal are spread over the second frequency band.

12. The method of claim 11, further comprising prior to the step of digitally deriving, the step of generating the base signal at a crystal oscillator.

13. The method of claim 11, in which the step of digitally deriving comprises the steps:

defining a set of divide-by terms using a partial fraction expansion of base signal frequency divided by the desired frequency; and defining the pattern for changing the reference frequency signal period as a function of the divide-by terms.

14. The method of claim 13, in which the step of defining a pattern comprises dividing the base signal frequency in a serial chain of frequency division circuitry stages, each one of the stages performing a frequency division using a divide factor defined by a corresponding one of the divide-by terms; and wherein any one stage in the serial chain other than a last stage has the divide factor altered in response to a count-out of an immediately successive stage.

15. The method of claim 13, in which there are at least two frequency division circuitry stages, in which the base signal frequency divided by the desired frequency has a first integer part and a first remainder part, an inversion of the first remainder part comprising a second integer part, and in which the step of defining a set comprises defining the first integer part as a first divide-by term and the second integer part as a second divide-by term.

16. An apparatus for reducing EMI emissions in a digitally clocked system, comprising:

a plurality of dividers receiving as a clock input a base clock signal having a base clock signal frequency and a base clock signal period, the plurality of dividers dividing the base clock signal frequency to digitally derive a dithering reference frequency signal having a reference frequency signal period which changes between a first number of base signal periods and either one of an increment or decrement of the first number, the reference frequency signal period changing between the first number and an increment or decrement of the first number in a repeating pattern, wherein the repeating pattern is defined to have each active transition of the reference frequency signal occur at a base signal transition which most closely approximates a transition at a desired frequency; wherein the reference frequency signal approximates the desired frequency, the desired frequency not evenly divisible into the base signal frequency;

a frequency modulator receiving the reference frequency signal for varying the reference frequency signal in a periodic manner between an upper frequency limit and a lower frequency limit to generate a modulating reference signal, the upper frequency limit and lower frequency limit defining a first frequency band centered at the desired frequency; and a clock generating means receiving the modulating reference signal and deriving a respective clock signal from the modulating reference signal, wherein the respective clock signal has a clock signal frequency which varies within a second frequency band; and wherein electromagnetic emissions from the modulating reference signal are spread over the first frequency band, and wherein electromagnetic emissions from the clock signal are spread over the second frequency band.

17. The apparatus of claim 16 in which at least one of the generated clock signal and the modulated reference signal exhibits a harmonic, and in which at least one among the modulating reference signal, the generated clock signal and the exhibited harmonic have electromagnetic interference emissions spread over more than a 120 kHz bandwidth; and in which the upper frequency limit and the lower frequency limit define a bandwidth of not more than 5% of the average desired frequency.

18. The apparatus of claim 17 in which the modulating reference signal exhibits a triangular modulation waveform.

19. The apparatus of claim 16, in which the plurality of dividers are serially coupled to change the reference frequency signal period between the first number of base signal periods and an increment of the first number of base signal periods, each one of the plurality of dividers having a divide-by term, a least significant one of the plurality of dividers in the series having a divide-by term equal to said first number, a next least significant one of the plurality of dividers in the series having a divide-by term equal to a second number; and wherein the base clock signal frequency divided by the desired frequency has a first integer part and a first remainder part; and wherein the first number is defined as the first integer part; and wherein an inversion of the first remainder part comprises a second integer part; and wherein the second number is equal to the second integer part.

20. The apparatus of claim 16 in which the variation of the reference frequency signal in a periodic manner between an upper frequency limit and a lower frequency limit defines a modulation period matching horizontal retrace period of a display device receiving one of the plurality of respective clock signals.

21. The apparatus of claim 16 in which the clock generating means comprises a phase-locked loop circuit and a filter, the phase-locked loop circuit receiving the modulating reference signal at a first input and generating in response an output clock signal, the output clock signal fed back through the filter to a second input to the phase-locked loop circuit; and wherein the modulating reference signal varies in incremental steps, said step variation occurring at a step frequency within a bandwidth of the filter.

* * * * *